United States Patent [19]

Lee

[11] Patent Number: 5,433,974
[45] Date of Patent: Jul. 18, 1995

[54] METHOD OF DEPOSITING ANTI-DOMING MATERIAL TO PREVENT DOMING OF A SHADOW MASK

[75] Inventor: Wonbok Lee, Pusan, Rep. of Korea

[73] Assignee: Samsung Electron Devices Co., Ltd., Rep. of Korea

[21] Appl. No.: 307,396

[22] Filed: Sep. 16, 1994

Related U.S. Application Data

[63] Continuation of Ser. No. 107,343, Aug. 16, 1993, abandoned, which is a continuation of Ser. No. 812,134, Dec. 18, 1991, abandoned.

[30] Foreign Application Priority Data

Dec. 22, 1990 [KR] Rep. of Korea .................. 90-21547

[51] Int. Cl.$^6$ ............... C23C 16/34; C23C 16/06; H01J 29/81
[52] U.S. Cl. .................. 427/252; 427/255.1; 427/255.7; 313/402; 445/47
[58] Field of Search ............ 427/248.1, 255.1, 255.7, 427/252; 313/402; 378/35, 140; 430/5; 445/47

[56] References Cited

U.S. PATENT DOCUMENTS

| | | | |
|---|---|---|---|
| 3,794,873 | 2/1974 | Kaplan et al. | 313/85 S |
| 3,809,945 | 5/1974 | Roeder | 313/85 S |
| 4,442,376 | 4/1984 | Van Der Waal et al. | |
| 4,668,336 | 5/1987 | Shimkunas | 156/643 |
| 4,680,243 | 7/1987 | Shimkunas et al. | 430/5 |
| 4,704,094 | 11/1987 | Stempfle | 445/30 |
| 4,734,615 | 3/1988 | Koike et al. | 313/402 |
| 4,904,218 | 2/1990 | Tong | 445/47 |
| 4,964,145 | 10/1990 | Maldonado | 378/35 |
| 4,978,421 | 12/1990 | Bassous et al. | 156/645 |

FOREIGN PATENT DOCUMENTS 62-161952  7/1987  Japan .

*Primary Examiner*—Shrive Beck
*Assistant Examiner*—Bret Chen
*Attorney, Agent, or Firm*—Christie, Parker & Hale

[57] ABSTRACT

A method for producing a shadow mask not susceptible to doming which includes in the preferred embodiment the step of heating boron in a vacuum atmosphere of $5 \times 10^{-5}$ Torr at 2500°–2600° C. for 12–20 sec to deposit a boron layer of 1 μm on the surface of a shadow mask and introducing nitrogen gas for 12–20 sec with maintaining the vacuum level of $10^{-4}$ Torr to form a boron nitride layer of 2 μm. Titanium is then deposited in a vacuum atmosphere of $5 \times 10^{-5}$ Torr at 2400°–2600° C. for 25–35 sec to form a titanium layer of 1–2 μm on the boron nitride layer. The boron nitride layer having low thermal expansion coefficient prevents deformation by doming and the titanium layer having the good conductivity enables the anode voltage to be applied to the shadow mask.

6 Claims, No Drawings

METHOD OF DEPOSITING ANTI-DOMING MATERIAL TO PREVENT DOMING OF A SHADOW MASK

CROSS-REFERENCE TO RELATED APPLICATION

This is a continuation of application Ser. No. 08/107,343, filed Aug. 16, 1993, which is a continuation of application Ser. No. 07/812,134, filed Dec. 18, 1991 now abandoned.

FIELD OF THE INVENTION

The present invention relates to a method of depositing an anti-doming material of a shadow mask.

BACKGROUND OF THE INVENTION

A shadow mask is provided with many apertures through which electron beams emitted from an electron gun pass. The electron beams passing therethrough cause phosphors to be deposited on the inner surface of a face plate for emitting light. However, at the same time, a part of electron beams impinge the surface formed between the apertures, so that a dome is formed in the shadow mask by the heat generated from the impinging beams.

AS a result, the apertures of the shadow mask discontinue a scanning path thereby causing the deterioration of picture quality. Conventionally, to overcome this problem, when installing a frame at the inside of the face plate, a hook spring is placed to offset deformation of shadow mask due to the doming. However, this does not provide a structural solution for preventing or removing the doming thereof.

Another method to solve the doming problem is to provide a shadow mask made of invar alloy having extremely low thermal expansion coefficient. However, invar alloy is difficult to form and the cost thereof is high.

U.S. Pat. No. 4,442,376 describes a method involving coating a heavy metal layer on the side of the shadow mask facing the electron gun so that the electron beams impinging the shadow mask is reflected thereby preventing thermal expansion thereof. However, expansion of a shadow mask is also caused by the radiant heat at the inside of a color cathode ray tube so this is not a complete solution.

In an attempt to avoid the problems described above, recently a method of coating an anti-doming material on the surface of the shadow mask has been studied.

The anti-doming material used in this method expends backward in order to offset the deformation due to the doming of the shadow mask, so that the deformation by the doming is prevented. As materials effective in the anti-doming material, the possibilities aluminum having high thermal expansion coefficient and boron nitride ceramic having low thermal expansion coefficient. Aluminum used as the anti-doming material is easily oxidized when exposed to the air, so that as a antidoming material the boron nitride ceramic is more stable than aluminum. However, the boiling point of the boron nitride ceramic is more than 3000° C., so that when depositing the boron nitride ceramic, extraordinary deposition equipment which can endure the high temperature must be provided and the deposition process is complicated so there is no advantage.

SUMMARY OF THE INVENTION

The present invention involves the use of boron nitride formed by vapor deposition instead of the solid boron nitride ceramic as the anti-doming material.

Boron nitride formed by vapor deposition can be obtained by a comparatively simple method of introducing nitrogen in the boron depositing process. The melting point of boron is about 2300° C. and the boiling point thereof is about 2550° C. Thus, boron nitride can be much more easily handled compared with solid boron nitride ceramic.

Accordingly, a feature of the present invention is a method which includes the step of depositing boron nitride as an anti-doming material, that is, to prevent the doming of a shadow mask. According to the present invention a method is provided which comprises:

heating boron in a reduced pressure atmosphere, such as $5 \times 10^{-5}$ Torr, at a temperature above its boiling point, such as 2550°-2600° C. for a suitable time such as for 12-20 sec, and thus be deposited on the surface of a shadow mask in suitable thickness, such as 1 $\mu$m, introducing nitrogen gas under reduced pressure thereby forming a boron nitride layer of 2 $\mu$m suitable thickness, such as for 12-20 sec while maintaining a pressure of $10^{-4}$ Torr and depositing titanium in a reduced pressure atmosphere, such as $5 \times 10^{-5}$ Torr at 2400°-2600° C. for 25-35 sec thereby forming a titanium layer of 1-2 $\mu$m on the boron nitride layer.

In the shadow mask of the present invention, the boron nitride layer prevents deformation due to doming and since the titanium layer coated on the boron nitride has the good conductivity anode voltage can be applied to the shadow mask.

DESCRIPTION OF THE PREFERRED EMBODIMENT

To illustrate the presently preferred embodiment, a shadow mask on which a material is deposited is suspended inside a deposition chamber and a predetermined amount of boron is put in a boat. At that same time, the pressure level therein is maintained at $5 \times 10^{-5}$ Torr. Boron is heated at 2550° C. and then deposited for 15 sec. The heating of boron is performed by the E beam method (electron beam method). The total thickness formed from the deposition for 15 sec is about 1 $\mu$m.

Thereafter, nitrogen gas is introduced into the deposition chamber, the pressure is adjusted to $10^{-4}$ Torr and then the deposition is performed in the nitrogen atmosphere for 15 sec. The nitrogen gas introduced therein reacts with boron to form a boron nitride layer of 1 $\mu$m on the shadow mask. This results in an anti-doming layer of about 2 $\mu$m.

After deposition, the vacuum atmosphere is cleared, boron used as the depositing material is replaced with titanium, and the internal pressure level is modulated and maintained at $5 \times 10^{-5}$ Torr. Titanium is heated at 2500° C. for 30 sec and deposited on the boron nitride layer to a thickness of about 1-2 $\mu$m, thereby obtaining the desired shadow mask.

The shadow mask of the present invention is substantially free doming by the deposited boron nitride thereon with its low thermal expansion coefficient and, also, the titanium layer thereon enables anode voltage to be applied to the shadow mask since it has high conductivity, which boron nitride does not have.

The present invention has the advantage of easy use in practice since it can be performed at the relatively lower temperature than a method which uses boron nitride ceramic as the depositing material. Further, the thermal expansion coefficient of boron nitride is equal to that of boron nitride ceramic, so that the effect of boron nitride in preventing deformation due to the doming is the same as that of boron nitride ceramic.

What is claimed is:

1. A method for producing a shadow mask of a color cathode ray tube with apertures through which electron beams emitted from an electron gun pass which is not susceptible to doming comprising:
providing a metallic shadow mask,
heating boron in a deposition chamber under reduced pressure to deposit a boron layer on the surface of the shadow mask facing the electron gun,
introducing nitrogen into said chamber under reduced pressure to react with said boron and form a boron nitride layer, said boron nitride layer functioning to prevent deformation due to doming, and
introducing titanium into said chamber under reduced pressure and heating to deposit titanium as a layer onto the boron nitride layer, said titanium being applied for its high conductivity and to enable anode voltage to be applied to the shadow mask.

2. A method as claimed in claim 1, wherein boron is heated in a reduced pressure atmosphere of about $5 \times 10^{-5}$ Torr at 2500°-2600° C. for 12-20 sec and a boron layer of about 1 $\mu$m is deposited on the surface of the shadow mask.

3. A method as claimed in claim 1 wherein nitrogen gas is introduced into said chamber at a reduced pressure level of $10^{-4}$ Torr to form a boron nitride layer of about 2 $\mu$m.

4. A method as claimed in claim 3 wherein titanium is deposited onto the boron nitride layer while maintaining a reduced pressure level of about $5 \times 10^{-5}$ Torr at 2400°-2600° C. for 25-35 sec to form a titanium layer of 1-2$\mu$m on the boron nitride layer.

5. A method as claimed in claim 1, wherein an electron beam is used for heating and the boron nitride layer and titanium layer are coated on the side of a shadow mask which faces said electron beam.

6. A method as claimed in claim 1, wherein a coating of boron nitride is applied as a layer on both the inside and outside surface of a shadow mask.

* * * * *